United States Patent [19]

Hanna

[11] 4,007,418
[45] Feb. 8, 1977

[54] PERSONAL ELECTROSTATIC SAFETY MONITOR WITH INDUCTION PLATE SENSING MEANS

[76] Inventor: Harry A. Hanna, 3727 University, Apt. No. 2, Des Moines, Iowa 50311

[22] Filed: Apr. 11, 1975

[21] Appl. No.: 567,359

Related U.S. Application Data

[63] Continuation-in-part of Ser. No. 250,736, May 5, 1972, Pat. No. 3,878,459.

[52] U.S. Cl. .................. 324/72; 324/133; 340/258 D
[51] Int. Cl.² .............. G01R 31/02; G01R 19/16; G01R 29/12; H05F 3/00
[58] Field of Search ............. 324/51, 52, 72, 72.5, 324/67, 133, 32; 340/253, 255, 258 D

[56] References Cited

UNITED STATES PATENTS

| | | | |
|---|---|---|---|
| 2,109,189 | 2/1938 | Bly | 324/52 X |
| 3,009,099 | 11/1961 | Müller | 324/52 |
| 3,029,383 | 4/1962 | Douglas et al. | 324/72 X |
| 3,204,183 | 8/1965 | Hasenzahl | 324/72.5 X |
| 3,289,076 | 11/1966 | Edis et al. | 324/72.5 X |
| 3,309,690 | 3/1967 | Moffitt | 324/72 X |
| 3,452,346 | 6/1969 | Kupersmit | 324/72 X |
| 3,452,347 | 6/1969 | Stimson | 324/133 X |
| 3,482,235 | 12/1969 | Johnson | 324/72 X |
| 3,667,036 | 5/1972 | Seachman | 324/72 |
| 3,774,108 | 11/1973 | Ogilvie | 324/72 |
| 3,828,256 | 8/1974 | Liu | 324/72 X |

*Primary Examiner*—Gerard R. Strecker
*Attorney, Agent, or Firm*—Zarley, McKee, Thomte & Voorhees

[57] ABSTRACT

A personal electrostatic safety monitor comprising an electronic circuit which continuously monitors electrostatic energy transfer and similar forms of electrical energy transfer for the purpose of human safety. The electronic circuit employs lights, buzzers or other suitable alerting devices to provide personnel with a warning of conditions which create a hazard or nuisance with regard to static electricity or other forms of electrical energy.

1 Claim, 11 Drawing Figures

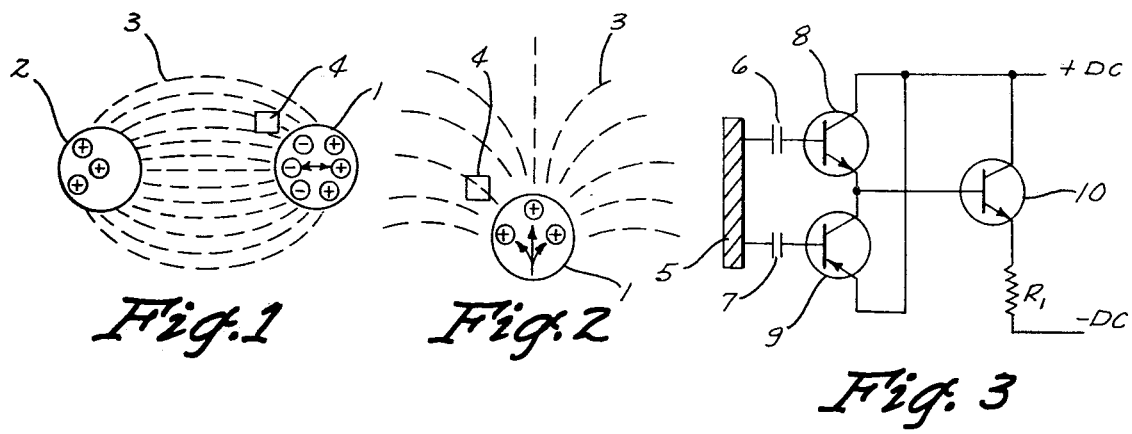
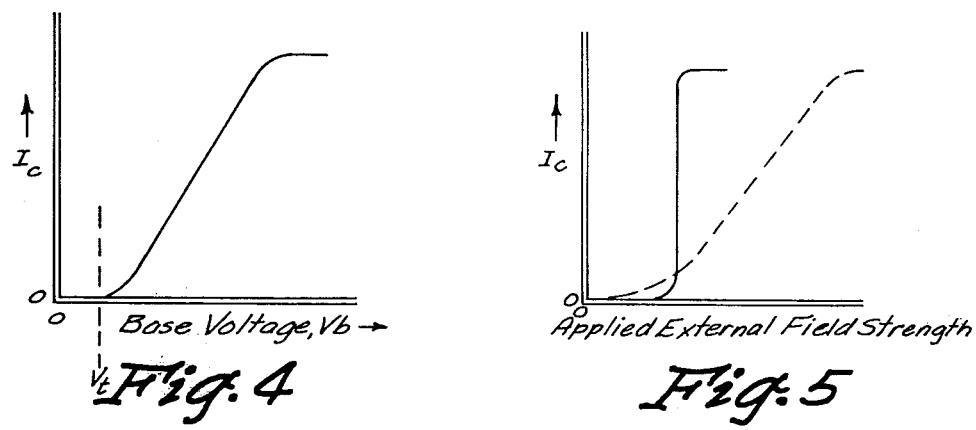
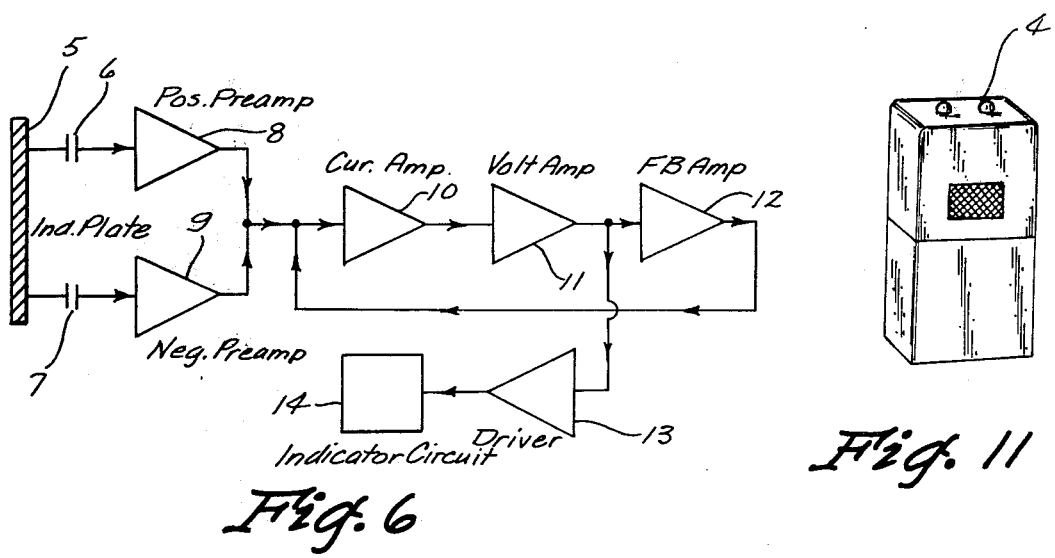

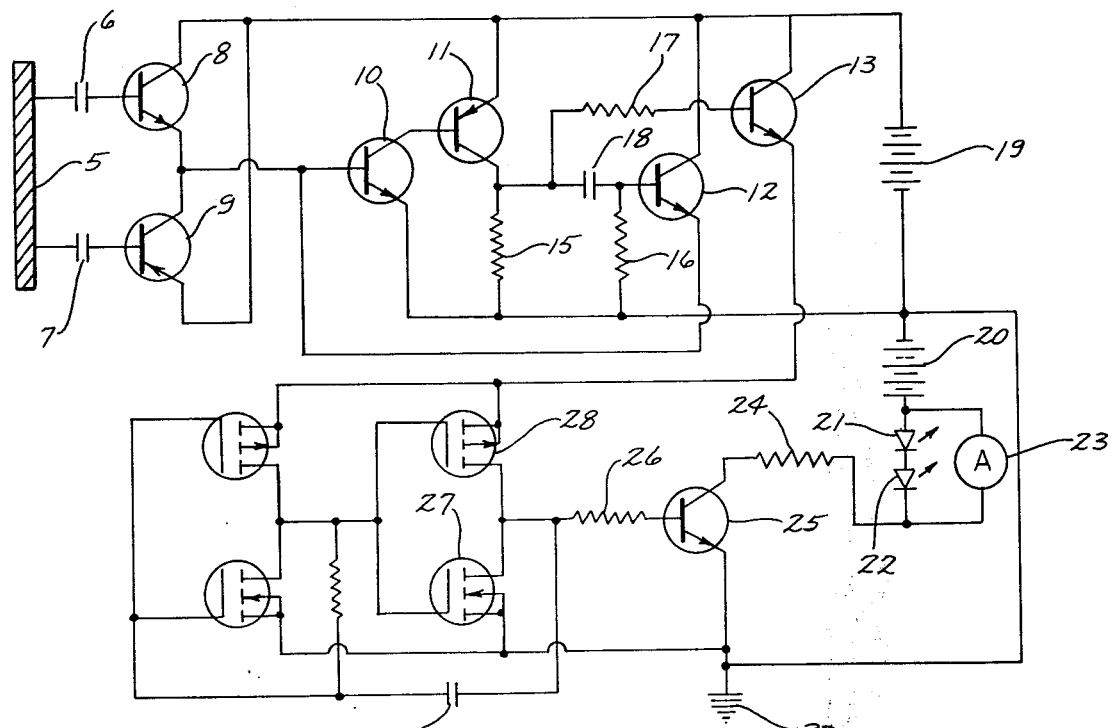
Fig. 7
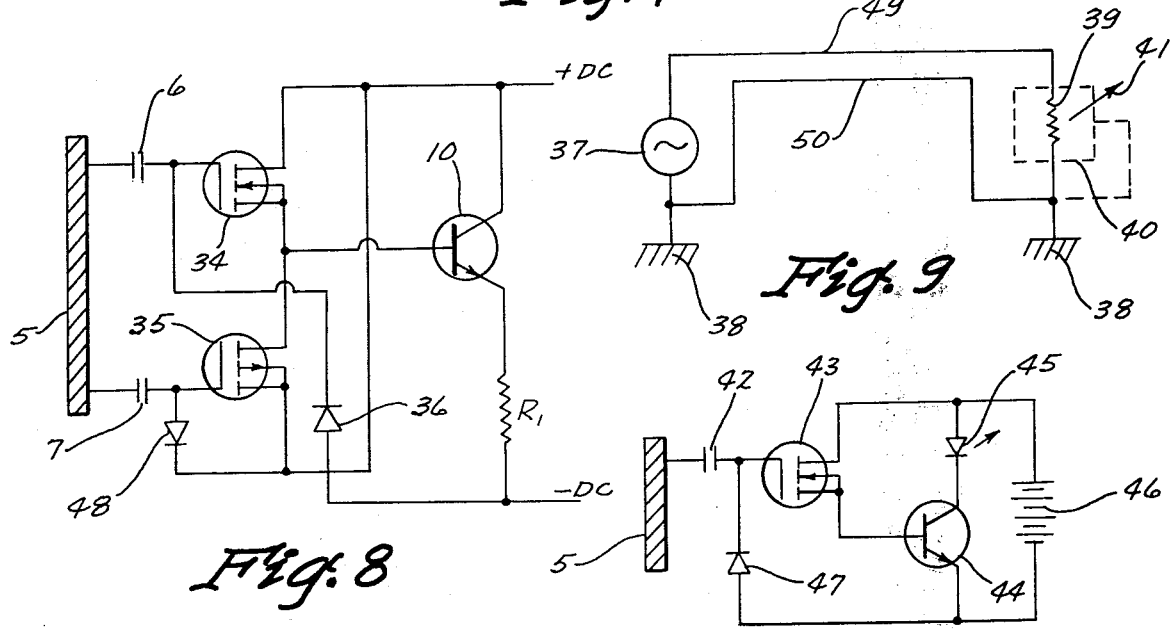
Fig. 8
Fig. 9
Fig. 10

PERSONAL ELECTROSTATIC SAFETY MONITOR WITH INDUCTION PLATE SENSING MEANS

This application is a continuation-in-part of application Ser. No. 250,736, filed May 5, 1972, now U.S. Pat. No. 3,878,459.

BACKGROUND OF THE INVENTION

The human environment has been detrimentally altered by the expanded use of electrical power and by the increased human exposure to substances or materials which are sensitive to electricity in a detrimental way. Electrical fields are commonly present in the human environment and may be caused by improperly operating electronic devices or electric equipment, improperly grounded electrical equipment, by static electricity generated by the movements of personnel, or by atmospheric electricity. It It is extremely important that the presence of the electrical fields and the transfer of such fields be detected to prevent human injury and property damage.

SUMMARY OF INVENTION

The personal electrostatic safety monitor of this invention is a self-contained, battery operated, portable safety appliance which is capable of being hermetically sealed in an operative condition as long as the internal battery power supply is energized. The size, weight and shape of the invention is such that it can be conveniently handled, carried, or worn as a part of a uniform or clothing, or held in a shirt pocket, or attached to a belt or lapel. Whatever the source of electrical energy involved, the various methods of application of the basic circuit and its modifications will aid in providing an interpretation of these electrical fields in terms of the safety hazard they represent. Examples of such applications are described as follows:

The circuit may be so constructed and adjusted to a predetermined threshold of electrical energy detection that is abritrarily set as a maximum safe limit in regard to the ignition sensitivity of specified categories of flammable or exposive substances such as primary or high explosives, gasoline or other petroleum products, organic solvents, anesthetic/oxygen mixtures, or dust including coal dust or saw dust, as well as many other substances.

The circuit may be so constructed and adjusted to a predetermined threshold of electrical energy detection that is arbitrarily set as a maximum safe limit in regard to the accidental damage of delicate electronic equipment or components, logic circuitry or computer memories or circuitry which may be adversely affected by discharges of static electricity or related forms of electrical energy.

The circuit may be so constructed and adjusted to a predetermined threshold of electrical energy detection that is arbitrarily set as a maximum safe limit in regard to the accidental damage of delicate electronic equipment or components, logic circuitry or computer memories or circuitry which may be adversely affected by discharges of static electricity or related forms of electrical energy.

The circuit may be so constructed and adjusted to a predetermined threshold of electrical energy detection that will provide a convenient and reliable indication of the grounded condition of electric or electronic equipment utilizing alternating current, high-frequency current, or equipment operated from alternating current supply lines.

As presented by the above partial listing of applications, the circuit and its modifications may be used to improve human safety by providing an advance warning to concerned personnel of impending hazards or nuisances due to the presence of static electricity or other inadvertent, stray, or uncontrolled forms of electrical energy.

The scope of this specification includes the circuit and various modifications to the circuit as described herein, as well as the concept of its application, or method. The invention is embodied by both the design of the circuit and the method of application.

The working of the electronic circuit employs a unique and novel concept of the "hazard value" of an electrostatic charge or other form of stray, transient, or incidental electrical energy. Such "hazard value" is not directly related to any one electrical parameter such as voltage, current, field strength, or quantity of charge. "Hazard value" is here described as a combination of factors which together define the circumstances by which electrical energy is capable of igniting flammable or explosive materials, causing electric shock, or causing damage to sensitive materials or electronic components.

These diverse factors which cause or contribute to the aforementioned hazards are most accurately guaged by measuring the rate of change of energy transfer from one place, object or thing to another. Since the primary purpose of the invention is its use as a safety appliance for personnel, its primary function is therefore to monitor the rate of energy transfer to or from the human body. The rate of change of energy transfer is used as an indication of hazardous conditions and it is related to such factors as:

1. The generation or accumulation of static electricity or related forms of electricity.
2. The extent or magnitude of the electrostatic charge or electrical generation.
3. The physical distance between the charged object, surface or source of electrical generation and a reference point determined by the location or use of the invention, i.e., human body.
4. Physical motion of the source of electrical energy or physical motion of the point of reference relative to the source.
5. The rate of physical motion.
6. Contact of personnel with electrical ground or electrically grounded objects.
7. The resistance of the ground path.
8. The frequency of alternating electrostatic fields which are changing in regard to amplitude or polarity.

Although the primary function of the invention is the monitoring of the energy transfer associated with the human body and the interpretation of the hazard thereof, an important secondary function of the invention is the monitoring of electrostatic fields associated with electric equipment, electric conductors, and other sources of electrical energy including atmospheric electricity. In this respect, the invention's sensitivity to the rate of change of electrostatic fields is used to advantage in the following manner. Modifications of the basic circuit may be used to identify ungrounded or improperly grounded electric or electronic equipment which is operated from alternating current supplies or which utilize alternating or high-frequency current.

Such improperly grounded equipment will radiate an alternating electrostatic field which is easily detected by the invention. Improperly grounded equipment in many cases is a safety hazard and may have capability to cause dangerous electric shock or to cause the ignition of sensitive flammable or explosive substances. Properly grounded equipment will in general not radiate an alternating electrostatic field.

The principal of operation for this feature of the invention is based on the fact that the most electric or electronic equipment, particularly equipment designed for use in hazardous environments, is enclosed in a metallic or otherwise conductive case, cabinet, or chassis which is connected to ground, generally through the third-wire electrical ground of the currrent supply. The grounded case, cabinet, or chassis will prevent radiation of electrostatic fields at the power line frequency, e.g., 60 cycles. An ungrounded or improperly grounded case, cabinet, or chassis will allow electrostatic radiation which can be conveniently detected by the invention. Such use of the invention has the advantage that it does not require actual physical connection for measurements nor an earth-ground reference point as required by conventional ohmeter any voltmeter measurements.

Another use of the invention is to provide utility work crews with a warning of high-voltage power lines or cables, or to determine if a power line or cable has been shut off without recourse to other conventional methods or current or voltage measurement. The invention is sufficiently sensitive to high-voltage alternating electrostatic fields that it can detect the power flowing through high-voltage utility lines at distances of several yards. The invention may also warn of accidental contact of tools, equipment, or vehicles to high-voltage power lines and aid in the prevention of accidental electrocution of personnel in work crews.

Another use of the invention is to provide a warning of the approach of electrical storms or atmospheric electrical disturbance, or high atmospheric potential gradients. Such use may be beneficial for explosive industries, blasting operations, etc.

Therefore, it is a principal object of this invention to provide a personal electrostatic safety monitor.

A further object of this invention is to provide a method by which hazardous conditions are identified in terms of the rate of energy transfer.

A further object of this invention is to provide personnel with a warning of the existence of hazardous conditions before these conditions can cause an accident or become a nuisance in respect to the generation or accumulation of static electricity and similar forms of stray, transient, or incidental electricity.

A further object of this invention is to provide an electronic circuit to be used as a personal electrostatic safety monitor which is small in size, portable, convenient to use, reliable, and capable of being hermetically sealed.

A further object of this invention is to provide a means of identifying ungrounded or improperly grounded electric equipment or electronic equipment, which is operated from alternating current sources of power.

A further object of this invention is to provide a personal electrostatic safety monitor which has an extremely low power drain from its internal battery supply during normal operation to allow a continuous monitoring for an extended period without battery change or recharging.

A further object of this invention is to provide a warning of high-voltage alternating current power lines or cables.

A further object of this invention is to provide a warning of the accidental contact of tools, equipment, or vehicles to high-voltage alternating power lines or cables.

A further object of this invention is to provide a warning of the approach of electrical storms, or the buildup of high atmospheric potential gradients.

A further object of this invention is to provide a means of tracing hidden wires or conductors carrying alternating current.

These and other objects will be apparent to those who have an understanding of the discipline of electrostatics and a knowledge of the electrical hazards and nuisances encountered in various occupations or environments wherein electrical power and electrical equipment is utilized, or where there is human exposure to electrically sensitive, flammable or explosive materials.

This invention consists of the method of application combined with the electronic circuit consisting of the construction, arrangement, and combination of its parts, whereby the objects contemplated are attained as hereinafter more fully set forth, specifically pointed out in the claims, and illustrated in the accompanying drawings in which:

BRIEF DESCRIPTION OF THE DRAWINGS

FIG. 1 is a simple illustration of electrostatic principles upon which the invention is based;

FIG. 2 is a further illustration complementing FIG. 1 and also showing electrostatic principles upon which the invention is based;

FIG. 3 is an electrical schematic showing a portion of one embodiment of the invention;

FIG. 4 is a graph representing current and voltage characteristics of the circuit of FIG. 3;

FIG. 5 is a graph representing the response of the circuit to external electrostatic fields;

FIG. 6 is a block diagram of one embodiment of the invention according to functions of the various parts;

FIG. 7 is an electrical schematic showing a portion of an alternate circuit also embodying the invention;

FIG. 8 is a complete detailed schematic of a working prototype of the invention;

FIG. 9 is an illustration of further electrostatic principles upon which a modification of the electronic circuit is based; and FIG. 10 is a complete detailed schematic of a modification of the electronic circuit to be used for a specific purpose as described in the text.

FIG. 11 is a perspective view of a small housing comprised of insulative material enclosing this invention so that it can be capacitively coupled to a human when touching the human body.

DETAILED DESCRIPTION

FIGS. 1 and 2 illustrate the method by which an electronic circuit is used to provide a warning of hazardous conditions by monitoring the energy transfer resulting from an electrostatic field surrounding the human body. These figures represent generalized cases only. Further illustrations which include specific details and values are beyond the scope of this specfication.

However, the validity of the application of these two general cases to the extreme majority of conceivably hazardous situations involving electricity can be attested to by persons having a knowledge of the subject, and it can also be demonstrated mathematically.

It should be noted that the polarities shown in the illustrations, as well as the directions of current flow, may be reversed without contradicting the statements of the general cases.

Referring now to FIG. 1, this represents the general case of the capacitive coupling of electrical energy or "charging by induction." Object 1 may be assumed to be a human body and represents the physical mass and electrical capacity of the human body. Object 2 is in the general work area and has been electrostatically charged by some incidental means. The human body 1 is within the radiated electrostatic field 3, emanating from object 2. The safety monitor of the invention 4 is held or worn on the clothing of human body 1 so that it is exposed to the field 3.

Assume that the human body 1 is engaged in the handling of an electrically sensitive, hazardous material. It is the object of the use of the invention 4 to give advance warning of hazardous conditions arising from the field 3. As shown in the illustration, the field 3 causes a separation of charges within the body 1. Safety monitor 4 is capable of evaluating the potential destructive capability of the field 3 with reference to the electrical capacity of object 1.

In order to obtain an accurate monitoring of the hazard of the situation represented in FIG. 1, the safety monitor 4 must have a preset sensitivity which corresponds to the classification of the ignition sensitivity of the material being handled. A broad classification of ignition sensitivity is stated in literature such as *Chemical Engineering*, Vol. 74, No. 6, Mar. 13, 1967, article entitled: "Basic Relationships of Electrostatics," F. G. Eichel, page 167, and specifically item 6, page 163, all of which is incorporated herein by reference. Most vapors in air have a minimum ignition energy of 0.1 millijoule; mists in air, 1 millijoule; dusts in air, 10 millijoules. These values can be adjusted for specific substances which may depart from the general classifications.

Ignition sensitivity of materials is determined experimentally by discharging controlled amounts of electrical energy in various mixtures of the test material with air. The warning sensitivity of the monitor of the invention is then adjusted to correspond to some safe limit below the ignition threshold. Since the monitor measures rate of energy transfer, its monitoring function corresponds exactly to the method for establishing ignition sensitivity, that is, rate of energy transfer in the electric discharge.

Since the ignition sensitivity of materials is the critical concern for the monitoring of electrostatic safety, the monitor 4 must do more than simply respond in a qualitative way to the presence of a static field. In outline, the monitor of the invention acts in the following method:

a. By being responsive to the rate of change of the field rather than simply detecting the presence of the field;

b. By quantatively comparing this rate of change with the electrical capacity of the human body 1 to arrive at an energy transfer figure; and c. By providing a warning at a pre-established safe limit.

Other considerations pertaining to the case of FIG. 1 which further illustrate the value of utilizing the rate of change of electrostatic field strength as an index of hazard can be explained on the basis that the ignition of electrically sensitive materials is generally regarded to have a thermal mechanism which is proportional to electrical power, as $$P = EI \qquad 1$$

where,
P = power in watts
E = potential in volts
I = current in amperes

Since FIG. 1 represents the capacitive transfer of energy, the quantity of electricity involved is given by, $$q = CE \qquad 2.$$

where
$q$ = quantity of charge in coulombs
$C$ = capacitance in farads

However, power, the destructive element, is related to current in eq. (1) and it is therefore a parameter of $q$ by the definition.

$$I = dq/dt \qquad 3.$$

where,
$t$ = time
$d$ = a small change in ...

Therefore, the development of power in the capacitive transfer of energy is a function of time, more specifically, the rate of change of $q$ with time. Since by Coulomb's Law an electrostatic charge, $q$, is attended by a proportional electrostatic field, the monitoring the rate of energy transfer provides an index of the destructive capability of electrical energy, or power. The same analysis also applies to the hazard of electric shock and damage to electrically sensitive materials, substances or objects.

As shown in the illustration of FIG. 1 and the accompanying text, the method as previously described is accomplished, namely a warning is elicited of hazardous conditions as defined by the rate of energy transfer field strength above a specified critical value. The critical value is concerned with the ignition energy of the category of materials exposed to the situation of FIG. 1, or other factors which may be evaluated for specific applications.

Referring now to FIG. 2, an object 1 is shown which is not within the electrostatic field of another object but which is receiving an electric current directly at some point A as shown. The current may be the result of contact with some material or substance which creates static charges at the point of contact, A, or the current may be the result of contact with some material or substance which is capable of delivering an electric current. An electrostatic field 3 will surround object 1 and it will change in value at a rate which is proportional to the current flowing into subject 1. The invention 4 will experience a portion of the electrostatic field 3 and it will also experience a proportionally induced current.

Assuming object 1 to be a human body with monitor 4 held or worn in close proximity to the body, the invention will measure the rate of energy transfer resulting from electric charges moving directly into the body.

In addition, once the body is charged, monitor 4 will continue to measure the rate of energy transfer between the charged body and other objects near the body. The energy transfer, whether it be into the body or out of the body, represents energy which is available for destructive discharge. Safety monitor 4 monitors this destructive potential in a quantative way and is therefore superior to any conventional device which makes only qualitative measurements, measurements of field strength or rate of change of field strength.

The case of FIG. 2 may be termed "charging by contact" and it is a case in which a quantity of charge is flowing into or possibly out of an object 1 having an electrical capacity, C. The energy received or delivered by a charged capacitance is expressed as, $$W = \tfrac{1}{2} C E^2 \qquad 4.$$

where,

W = energy in joules

However, as previously stated in the description of FIG. 1, it is electrical power which is the prime consideration, not energy. Power is related to energy as, $$P = W/t \qquad 5.$$

Again time appears in the denominator and establishes a rate of change. W may change with time as either or both of its parameters change with time: $dC/dt$ or $dE/dt$, but in each case the attending electrostatic field will change proportionally, and energy will be transferred proportionally.

Referring now to FIG. 3, the induction plate 5 is a conductor in the form of a plate, wire, rod, etc. which is electrically insulated from the electronic circuit. The function of the induction plate 5 is to make the input of the electronic circuit non-directional in terms of its sensitivity to external electrostatic fields. External electrostatic fields create a potential on the induction plate 5 which is capacitively coupled through capacitors 6 and 7 to the positive and negative charge preamplifiers, transistors 8 and 9, respectively. The capacitive charge coupled to transistors 8 and 9 results in a current flow in the base leads of these transistors which is proportional to the rate of change of external electrostatic fields. The transistor 8 is an NPN device at zero base bias and it is responsive to positive currents. The transistor 9 is a PNP device and it is responsive to negative currents. Balance of the response of the two transistors is achieved by the degree of capacitive coupling 6 and 7 to the induction plate 5. Transistors 8 and 9 are directly coupled in Darlington fashion to the current amplifier, NPN transistor 10. The resistor, $R_1$, is not a real part of the electronic circuit but represents the input impedance of the following amplifier states which are not shown in this illustration. The significant features of this part of the electronic circuit are: a sensitivity to both positive and negative currents, zero base bias on all transistors in the normal or idling state causing collector cut-off and essentially zero collector current flow for prolonged battery life, and a means of establishing a circuit response set at a preset threshold. The preset threshold corresponds to the degree of capacitive coupling 6 and 7 of the base leads of transistors 8 and 9 of the induction plate 5, and also to the physical size and position of the induction plate 5 with respect to the rest of the circuit. Since the transistors have zero base bias, external electrostatic fields must create a base potential above the base conduction threshold of the transistors to cause collector current. This potential for bipolar transistors is generally on the order of a few tenths of a volt.

This principle is illustrated in FIG. 4, a graph which shows the general form of the function of collector current $I_c$, vs. base voltage $V_b$. The dotted line, $V_t$, indicates the conduction threshold for bipolar transistors. Potentials below this value, $V_t$, have no effect on collector current. The insensitivity of the circuit to externally applied potentials below this value prevents the circuit from responding to electrostatic fields of significant strength.

FIG. 5 is a graph which illustrates a principle utilized by the invention to conserve battery power. The dotted line represents a typical amplifier function in terms of total collector current, $I_c$, and applied external field strength. As shown, a linear amplifier arrangement would provide a minimal response to minimal fields above $V_t$ threshold. Fields of greater strength would elicit an amplifier response of greater collector current. Since it is desired to employ a circuit which indicates only two conditions, safe or unsafe, the graduated response represented by the dotted line is unsatisfactory. Therefore, positive regeneration or feed-back is used to tailor the circuit response as represted by the solid line. This function shows only two circuit states: off or on, with no graduation between. The off-on states correspond to safe and unsafe.

FIG. 6 is a block diagram of the basic circuit arrangement according to function. The functions denoted by numbers 5 through 10 were previously explained in FIG. 3. Continuing with the explanation from the current emplifier, 10, the voltage amplifier 11 has sufficient output for operating the driver 13 and the feed-back amplifier 12. The output of the feed-back amplifier 12 is coupled back to the input of the current amplifier 10 to establish a circuit response as illustrated by the solid line in FIG. 5. While the regenerating feature of the feed-back amplifier drives the amplifiers 10 and 11 into saturation, the driver amplifier 13 is also saturated, providing power to the indicator circuit 14. This circuit may utilize lights, buzzers, or other suitable alerting devices to attract the attention of the person using the invention. The important features of the invention which are illustrated by the block diagram are: a tailored response which consists of two states, off and on; and a circuit insensitivity to marginal values of external electrostatic field strength.

FIG. 7 is a complete, working electrical schematic of a prototype of the invention which utilizes at least all of the features previously explained. External electrostatic fields changing at a rate sufficient to define a hazardous condition cause an induced current from the induction plate 5 through capacitors 6 and 7 to the base leads of transistors 8 and 9. The output of either transistor 8 or 9, depending on whether the induced current is positive or negative, respectively, is coupled to the current amplifier 10 and the voltage amplifier 11. The voltage amplifier 11 is a PNP bipolar transistor with collector loading. Transistor 11 is also normally in the cut-off condition. The voltage appearing across the 10K ohm collector load resistor 15 is coupled to the NPN bipolar transistor, driver amplifier 13 through the 10K ohm base current limiting resistor 17. The voltage across resistor 15 is also coupled to the feed-back amplifier 12, an NPN transistor which provides regenerative current to the base of current amplifier 10. Coupling from resistor 15 to transistor 12 is through a 4.7 uF capacitor 18 and across a 3.9 megohm base return resistor 16. Capacitor 18 blocks DC current from the base of transistor 12 and the resistor 16 insures that transistor 12 remains normally in a cut-off condition. In addition, resistor 16 and capacitor 18 form an RC network giving the circuit a time constant of approximately 6 seconds. This feature acts as a one-shot multivibrator which keeps the circuit in a saturated or on state for approximately 6 seconds regardless of the duration of the signal from the positive and negative preamplifiers, 8 and 9, respectively. As a result the circuit gives a 6 second indication to very fast transients of external fields.

As feed-back is established in the circuit, the driver transistor 13 goes into saturation and provides power to the multivibrator circuit which is formed by the MOS FET enhancement transistors 27, 28, 29 and 30. These four transistors are in a conventional free-running circuit with a time constant established by the 0.5 megohm resistor 31 and the 4.7 uF capacitor 32. The multivibrator frequency is approximately 3 pps. The square wave output of the multivibrator is coupled to the secondary driver, NPN transistor 25, through a 1.0 megohm base current limiting resistor 26. Power for the portion of the circuit up to, but not including transistor 25, is obtained from the 5.4 volt mercury battery 19.

The secondary driver transistor, NPN bipolar transistor 25, goes in and out of saturation with the square wave output of the multivibrator and sends a 3 pps collector current through the 22 ohm current limiting resistor 24 and the light-emitting-diodes 21 and 22, as well as the miniature buzzer 23. Power for these indicators is taken from the 5.4 volt mercury battery 20.

Important features of this prototype circuit are: essentially zero collector or drain current for all transistors during idling, a sensitivity to very high frequencies of external electrostatic fields, a sensitivity to very fast transients of external electrostatic fields, a controlled and sustained unsafe indication, lower power consumption, a low number of passive components, and a tailored response giving precisely defined states of off and on.

FIG. 8 is an electrical schematic representing a modification of the circuits of FIGS. 3 and 7. FIG. 8 shows a pair of MOS FET enhancement transistors 34 and 35 used as the positive and negative preamplifiers. Transistor 34 is an N-channel device for positive inputs and transistor 35 is a P-channel device for negative inputs. These transistors have a high input impedance which is advantageous for preamplifier use. They are shown coupled in complimentary configuration to the current amplifier, bipolar transistor 10. $R_1$, again represents the input impedance of subsequent amplifier stages not shown in FIG. 8. The diodes of 36 and 48 provide a high value of gate return resistance and some degree of overload protection. The diodes 36 and 48 stabilize transistors 34 and 35 and prevent drift. The resistance of the diodes is very high due to the fact that they are reverse biased as shown.

The important features of this circuit modification are: a very high input impedance, typically $10^{10}$ to $10^{12}$ ohms; an extended time constant of the preamplifier circuitry; and improved temperature stability.

FIG. 9 represents a simplified diagram illustrating the electrostatic principle used to determine the grounded condition of electric or electronic equipment operated from conventional 60 cycle current supply lines. The generator 37 is an electric power utility generating station. The wires 49 and 50 are transmission lines on utility poles. Line 50 is common with earth ground and line 49 is referred to as "hot." The generator output is grounded at 38, the power station ground. The power receiving end which is represented by the resistor 39 is grounded also at 38, earth ground. The resistor 39 is assumed to be some electrical equipment utilizing power. The dotted line 40 represents a metal cover, case, or chassis around the electric equipment. If this is properly grounded, no 60 cycle electrostatic field will be radiated from the equipment 39. The grounded case, or chassis provides Faraday screening. If proper grounding is not established, a field will be radiated from the electric equipment 39 as represented by the arrow 41. The invention may be used to detect the radiated field thereby determining if the electric equipment 39 is properly grounded.

FIG. 10 is an electric schematic of a modification of the basic circuit to improve its performance for the specific purpose of detecting radiated electrostatic fields of alternating current at the power-line frequency for the purpose as described above in FIG. 9.

Since alternating electrostatic fields are being detected, only one preamplifier stage 43 is required which may amplify either positive or negative fields. The figure illustrates an N-channel MOS FET of the enhancement type as preamplifier 43. This transistor amplifies the positive side of the input signal. Preamplifier 43 is coupled in Darlington fashion to the NPN driver, bipolar transistor 44. Driver 44 operates the light-emitting-diode 45 to indicate the detection of an AC electrostatic field. The entire circuit has essentially zero collector and drain current in the normal state for prolonged battery life. A feed-back circuit and amplifier is not required. The diode 47 in the gate circuit of transistor 43 is reverse biased and provides a high impedance ground return to the gate for stabilization. A P-channel MOS FET may also be used in conjunction with a bipolar transistor for the same function. The induction plate 5 and coupling capacitor 42 couple the external AC field to the preamplifier 43. Power for the circuit is taken from the 5.4 volt mercury battery 46.

Thus it can be seen that the electronic circuits and their modifications as well as the method of employing these circuits as described will accomplish al least all of the stated objectives.

With the personal electrostatic safety monitor, it is possible for persons to obtain warnings of impending hazards or nuisances due to static electricity and other forms of electrical energy.

The personal electrostatic monitor if this invention has the capability of detecting very low voltages, i.e., 0.5 volts or less. And more importantly, it detects the rate of transfer of electrostatic fields. In use, as heretofore explained, the monitor is capacitively connected to the human body which acts as a reference for detection of rate of energy transfer. When the monitor is capacitively coupled to the body it can detect rates of energy transfer as low as 0.1 millijoules or even lower to the lowest value of ignition sensitivity of any known material, lead azide at $4 \times 10^{-10}$ joules.

What is claimed is:

1. A personal safety monitor for detecting the presence of an electrostatic field and for detecting the rate of transfer of said field from one object to another field, comprising, an insulating housing and within said housing, an induction plate means,
a positive charge transistor,
a negative charge transistor,
a first capacitor coupling said induction plate means with said positive charge transistor,
a second capacitor coupling said induction plate means with said negative charge transistor,
a current amplifier comprising a transistor coupled in Darlington fashion to said positive and negative charge transistors,
a voltage amplifier coupled to said current amplifier,
a feed-back amplifier coupled to said voltage amplifier,
said feed-back amplifier also being coupled to the input of said current amplifier,
a driver stage coupled to said voltage amplifier,
and in indicator circuit coupled to said driver stage and comprising a signal means which is energized upon said induction plate means being exposed to an electrostatic field above a predetermined threshold hazard value, the degree of capacitive coupling of said first and second capacitors to said induction plate means and the size and position of said induction plate means with respect to the remainder of said circuit, being such that the circuit is activated only above said predetermined threshold hazard value.

* * * * *